United States Patent
Aldridge, Jr. et al.

(10) Patent No.: US 11,177,345 B1
(45) Date of Patent: Nov. 16, 2021

(54) HETEROJUNCTION BIPOLAR TRANSISTOR

(71) Applicant: GLOBALFOUNDRIES U.S. INC., Santa Clara, CA (US)

(72) Inventors: Henry L. Aldridge, Jr., Malta, NY (US); Anthony K. Stamper, Burlington, VT (US); Jeonghyun Hwang, Ithaca, NY (US); Johnatan A. Kantarovsky, South Burlington, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/893,855

(22) Filed: Jun. 5, 2020

(51) Int. Cl.
*H01L 29/08* (2006.01)
*H01L 29/66* (2006.01)
*H01L 29/417* (2006.01)
*H01L 29/737* (2006.01)

(52) U.S. Cl.
CPC .... *H01L 29/0821* (2013.01); *H01L 29/41708* (2013.01); *H01L 29/66242* (2013.01); *H01L 29/737* (2013.01)

(58) Field of Classification Search
CPC ........... H01L 29/0821; H01L 29/66242; H01L 29/737; H01L 29/41708
See application file for complete search history.

(56) References Cited

U.S. PATENT DOCUMENTS

| | | |
|---|---|---|
| 5,976,970 A | 11/1999 | Dalal et al. |
| 8,674,472 B2 | 3/2014 | Botula et al. |
| 8,860,092 B1* | 10/2014 | Li ................... H01L 29/66318 257/197 |
| 9,048,284 B2 | 6/2015 | McPartlin et al. |
| 9,349,793 B2 | 5/2016 | Jaffe et al. |
| 10,388,728 B1 | 8/2019 | Zierak et al. |
| 2008/0303090 A1 | 12/2008 | Ieong et al. |
| 2010/0327280 A1* | 12/2010 | Joseph .............. H01L 21/76224 257/51 |
| 2013/0187198 A1* | 7/2013 | Camillo-Castillo ........................ H01L 29/7371 257/197 |
| 2015/0194416 A1 | 7/2015 | Cheng et al. |
| 2016/0372582 A1* | 12/2016 | Camillo-Castillo ........................ H01L 29/0821 |

OTHER PUBLICATIONS

Hashimoto et al., "A Study on Suppressing Crosstalk Through a Thick SOI Substrate and Deep Trench Isolation", IEEE, Jul. 2013, vol. 1, No. 7, 7 pages.

Vivek Bharambe et al., "Liquid-Metal-Filled 3-D Antenna Array Structure With an Integrated Feeding Network", IEEE Antennas and Wireless Propagation Letters, vol. 17, No. 5, May 2018, 4 pages.

* cited by examiner

*Primary Examiner* — Syed I Gheyas
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to heterojunction bipolar transistors and methods of manufacture. The structure includes: a first semiconductor layer including a device region; a second semiconductor layer under the first semiconductor layer; a layer of conductive material between the first semiconductor layer and the second semiconductor layer; at least one contact extending to and contacting the layer of conductive material; and a device in the device region above the layer of conductive material.

20 Claims, 3 Drawing Sheets

HETEROJUNCTION BIPOLAR TRANSISTOR

FIELD OF THE INVENTION

The present disclosure relates to semiconductor structures and, more particularly, to heterojunction bipolar transistors and methods of manufacture.

BACKGROUND

A heterojunction bipolar transistor (HBT) is a type of bipolar junction transistor (BJT) which uses differing semiconductor materials for the emitter and base regions or collector and base regions, creating a heterojunction. Si/SiGe HBTs are used in power amplifier applications and require low collector-base capacitance (Ccb), low base resistance (Rb), high cut-off frequencies fT/fMAX and high breakdown voltages (BVceo, BVcbo, BVebo).

In high performance Si/SiGe HBT technologies, some integration schemes result in high Rc (collector resistance), which is a major component to the HBT performance. For example, high Rc is a concern in bipolar technologies as it limits device scaling for improved fT/fMAX. In an attempt to solve such problems, integration schemes rely on heavy doping, e.g., to its solubility limits, but this results in higher Ccb (collector base capacitance).

SUMMARY

In an aspect of the disclosure, a structure comprises: a first semiconductor layer including a device region; a second semiconductor layer under the first semiconductor layer; a layer of conductive material between the first semiconductor layer and the second semiconductor layer; at least one contact extending to and contacting the layer of conductive material; and a device in the device region above the layer of conductive material.

In an aspect of the disclosure, a structure comprises: a first semiconductor layer; a second semiconductor layer under the first semiconductor layer; a deep trench isolation structure extending through the first semiconductor layer and the second semiconductor layer, and defining a device region; a transistor within the device region; a layer of conductive material between the first semiconductor layer and the second semiconductor layer and extending underneath the transistor; and at least one contact extending through the first semiconductor layer and contacting the layer of conductive material.

In an aspect of the disclosure, a method comprises: forming a first semiconductor layer; forming a layer of conductive material on the first semiconductor layer; forming a second semiconductor layer on the layer of conductive material; forming an opening in the second semiconductor layer, extending to the layer of conductive material; filling the opening with a conductive material; and forming a device on the second semiconductor layer above the layer of conductive material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to heterojunction bipolar transistors and methods of manufacture. More specifically, the present disclosure relates to a heterojunction bipolar transistor with a buried conductive (e.g., metal) feature in the sub-collector and collector region of the substrate. Advantageously, the buried conductive (e.g., metal) feature of the heterojunction bipolar transistor results in a reduced collector resistance and an increase in fT/fMAX within the sub-collector region.

The heterojunction bipolar transistor of the present disclosure can be manufactured in a number of ways using a number of different tools. In general, though, the methodologies and tools are used to form structures with dimensions in the micrometer and nanometer scale. The methodologies, i.e., technologies, employed to manufacture the heterojunction bipolar transistor of the present disclosure have been adopted from integrated circuit (IC) technology. For example, the structures are built on wafers and are realized in films of material patterned by photolithographic processes on the top of a wafer. In particular, the fabrication of the heterojunction bipolar transistor uses three basic building blocks: (i) deposition of thin films of material on a substrate, (ii) applying a patterned mask on top of the films by photolithographic imaging, and (iii) etching the films selectively to the mask.

Figure 1:
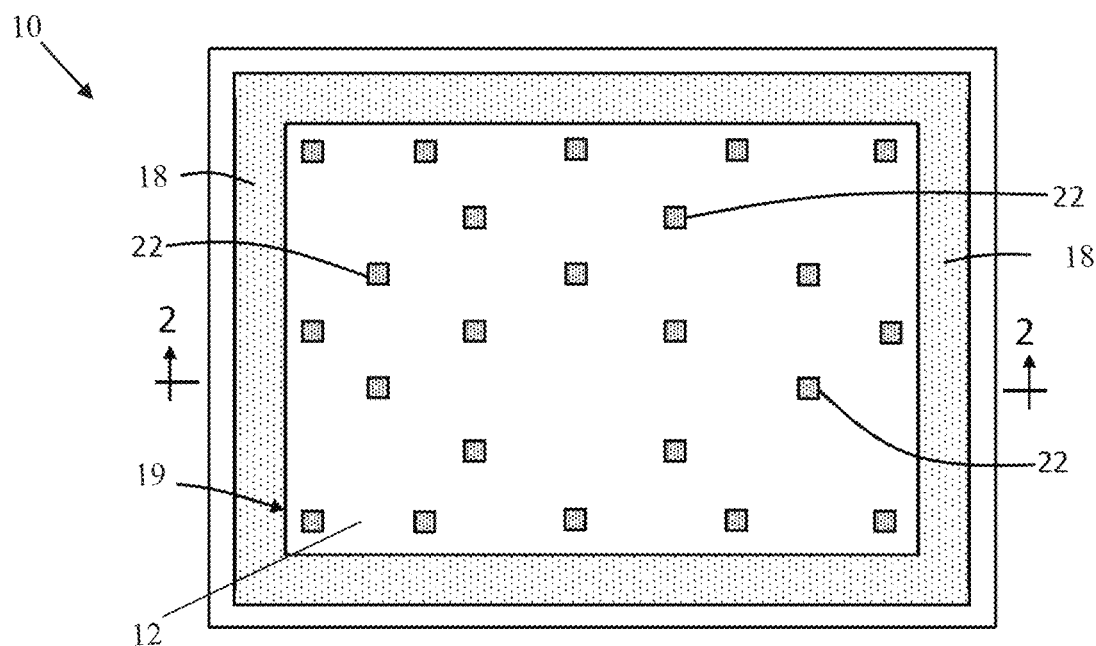
FIG. 1 shows a top view of a substrate with openings, amongst other features, and respective fabrication processes in accordance with aspects of the present disclosure.
Figure 2:
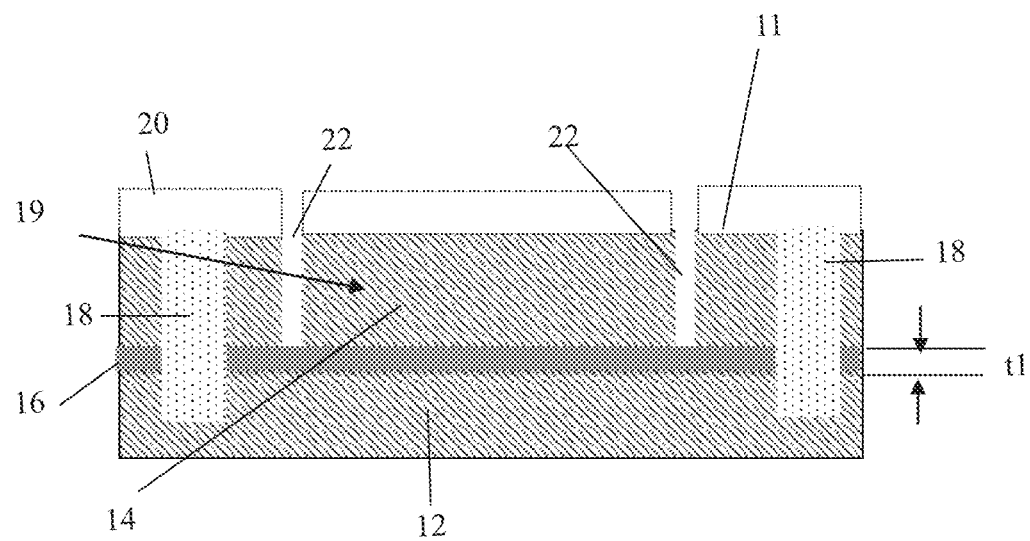
FIG. 2 shows a cross-sectional view of the structure of FIG. 1, along line 2-2.

FIG. 1 shows a top view of a substrate with openings, amongst other features, and respective fabrication processes in accordance with aspects of the present disclosure. FIG. 2 shows a cross-sectional view of the structure of FIG. 1, along line 2-2. More specifically and referring to FIGS. 1 and 2, the structure 10 comprises semiconductor layers 12, 14. In embodiments, the semiconductor layers 12, 14 may be composed of single-crystal silicon; although other materials are also contemplated herein. For example, the semiconductor layer 14 can be a high-resistivity bulk silicon wafer having a resistivity greater than or equal to 1 kOhm-cm. Additional materials may include, but not limited to, SiC, GaAs, InAs, InP, and other II/V or II/VI compound semiconductors.

A semiconductor layer 16 is provided between the semiconductor layers 12, 14. In embodiments, the semiconductor layer 16 is epitaxially grown over the semiconductor layer 14 using the semiconductor layer 14 as a growth seed, and the semiconductor layer 12 is epitaxially grown over the semiconductor layer 16 using the semiconductor layer 16 as a growth seed. The semiconductor layer 16 may be composed of a SiGe or other material that has an etch selectivity to the semiconductor layers 12, 14 (e.g., silicon). As used herein, the term "selective" is used in reference to a material removal process (e.g., etching) that, with an appropriate etchant choice, the material removal rate (i.e., etch rate) for the targeted material is greater than the removal rate for at least another material exposed to the material removal process.

In embodiments, the semiconductor layer 16 may be composed of SiGe which includes a percentage of Ge that enables a higher etch rate than silicon. In further embodiments, the semiconductor layer 16 may have a thickness, t1, which is less than or equal to 50 nanometers; whereas, the semiconductor layer 14 may have a thickness that is less than or equal to 500 nanometers such that a top surface of the semiconductor layer 16 is spaced from the top surface 11 of the semiconductor layer 14 by a distance that is less than or equal to 500 nanometers; although other dimensions are contemplated herein.

Still referring to FIGS. 1 and 2, a deep trench isolation structure(s) 18 is provided within the substrate, extending within semiconductor layers 12, 14, 16. More specifically, the deep trench isolation structure 18 extends from the top surface 11 of the semiconductor layer 14 through the semiconductor layer 12, semiconductor layer 16 and penetrating to a shallow depth into the semiconductor layer 12. The deep trench isolation structure 18 surrounds a section of the semiconductor layer 14 to define a device region 19 that may be used in frontend-of-line (FEOL) devices, e.g., heterojunction bipolar transistor (HBT).

The deep trench isolation structure(s) 18 can be formed by conventional lithography, etching and deposition methods known to those of skill in the art. For example, a resist formed over the semiconductor layer 14 is exposed to energy (light) to form a pattern (opening). An etching process with a selective chemistry, e.g., reactive ion etching (RIE), will be used to form one or more trenches in the semiconductor layers 12, 14, 16 through the openings of the resist. Following the resist removal by an oxygen ashing process or other known stripants, insulator material, e.g., $SiO_2$, can be deposited within the trenches by any conventional deposition processes, e.g., chemical vapor deposition (CVD), atomic layer deposition (ALD), thermal oxidization, etc. processes. Any residual material on the surface of the semiconductor layer 14 can be removed by conventional chemical mechanical polishing (CMP) processes.

FIGS. 1 and 2 further show openings 22 formed within the device region 19. The openings 22 extend to the semiconductor layer 16. In alternative embodiments, the openings 22 may penetrate partially through the semiconductor layer 16. In further alternative embodiments, the openings 22 may penetrate completely through the semiconductor layer 16 and into the underlying semiconductor layer 14. In any of these scenarios, the semiconductor layer 16 will be exposed for subsequent removal.

In embodiments, to form the openings 22, an etch mask 20, shown in dashed lines, is formed over the top surface 11 of the semiconductor layer 12 and deep trench isolation structure(s) 18, and is arranged to cover the device region 19. The etch mask 20 may include a photoresist that is applied as a coating by a spin coating process, pre-baked, exposed to light projected through a photomask, baked after exposure, and developed with a chemical developer to form openings. A directional etching process, such as RIE, is used to form the openings 22 at the locations of openings in the etch mask 20. The openings 22 penetrate completely through the semiconductor layer 12 exposing the material of the semiconductor layer 16.

The openings 22 may be arranged in a regular array or another pattern across the top surface 11 of the device region 19, or the arrangement of the openings 22 may be placed in random positions. The number and size of the openings 22 may also vary depending on design parameters, and/or the ability of the etchant chemistry to remove the semiconductor layer 16 in subsequent processing steps. In embodiments, and as should be understood by those of skill in the art, the etching process will remove the material of the semiconductor layer 12 selective to the material of the semiconductor layer 16 such that the semiconductor layer 16 may function as an etch stop.

Figure 3:
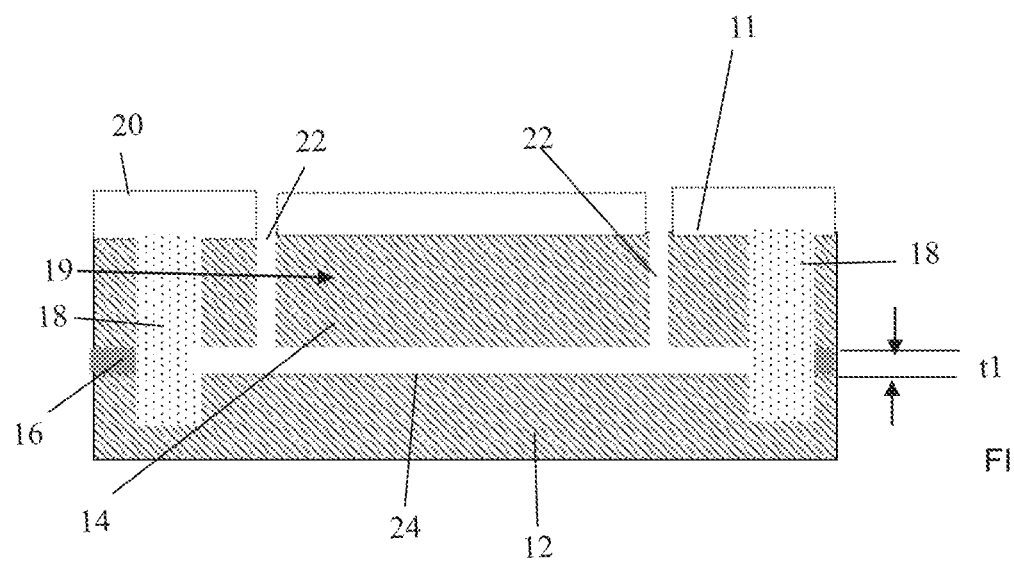
FIG. 3 shows an airgap arranged between semiconductor layers, amongst other features, and respective fabrication processes in accordance with aspects of the present disclosure.

FIG. 3 shows an airgap 24 arranged vertically between the device region 19 of the semiconductor layer 12 and the semiconductor layer 14, and extending within the area of the deep trench isolation structure 18 (e.g., which defines the collector region and sub-collector region of a heterojunction bipolar formed in the device region 19). To form the airgap 24, the semiconductor layer 16 is removed from beneath the device region 19 using an anisotropic etching process through the openings 22, selective to the semiconductor layers 12, 14, and the material of the deep trench isolation structure 18.

As should be understood by those of skill in the art, the anisotropic etching process includes a lateral etching component that etches the sacrificial layer, e.g., semiconductor layer 16, starting at the locus of each opening 22 and expanding outwardly until the individual etched volumes merge together to form the airgap 24. In embodiments, the airgap 24 may have a height equal to the thickness of the semiconductor layer 16. In embodiments, the etchant can be a dry etch with etchant chemistry of, for example, hot ammonia ($NH_3$) and/or hydrochloric acid (HCl) vapor.

In further embodiments, the device region 19 is attached to the deep trench isolation structure 18 about its perimeter, e.g., entire perimeter. The deep trench isolation structure 18 surrounding the device region 19 can apply an inward compressive stress on the device region 19 at the sidewall of the device region 19. The inward compressive stress physically and structurally supports the device region 19 and prevents its collapse after the airgap 24 is formed. The semiconductor layer 16 outside of the deep trench isolation structure 18 is not removed and also surrounds the airgap 24 on all sides.

Figure 4:
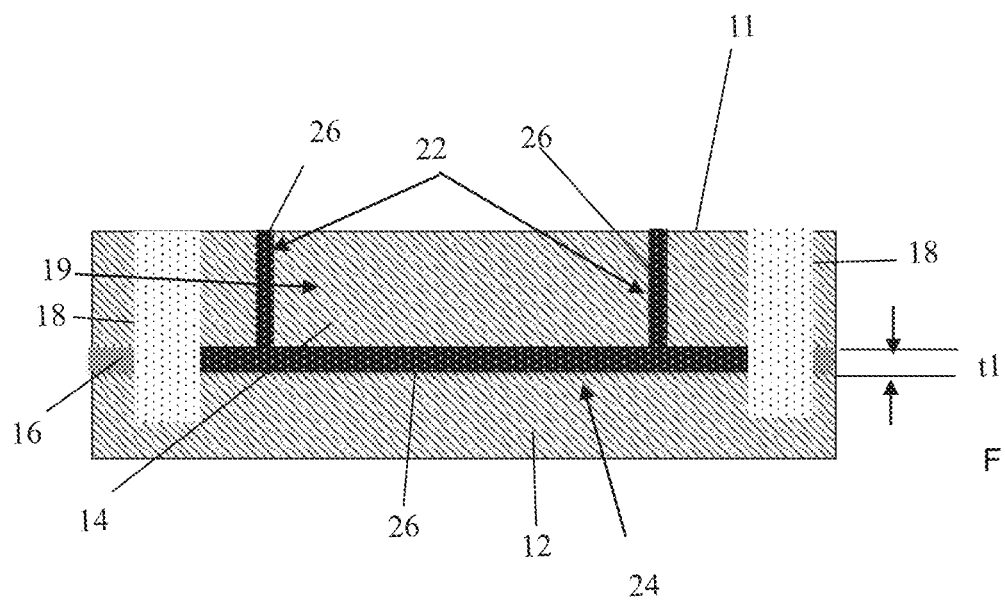
FIG. 4 shows conductive material within the airgap and openings, amongst other features, and respective fabrication processes in accordance with aspects of the present disclosure.

Referring to FIG. 4, the mask 20 is removed and the openings 22 and the airgap 24 are filled with a conductive material 26. The mask 20 can be removed by any conventional etching techniques or stripant processes known to those of ordinary skill in the art such that no further explanation is required for a complete understanding of the present disclosure.

In embodiments, the openings 22 and the airgap 24 are filled with a conductive material 26, e.g., metal material that is deposited through the openings 22 and forms laterally in the airgap 24. The conductive material 26 can be any of the family of conductors, metals, metal alloys, e.g., Al, Co, Ni, W, TiN, Ta, Pt, etc. In embodiments, the conductive material should have a resistivity of about 10 $\mu\Omega$-cm; although other resistivities are contemplated herein. The conductive material 26 can be deposited by any known conventional deposition method used for such purposes including, e.g., CVD or atomic layer deposition (ALD). The formation of the airgap 24 and filling of the airgap 24 with the conductive material 26 can be performed prior to or after the formation of the heterojunction bipolar transistor 28 as shown in FIG. 5.

Figure 5:
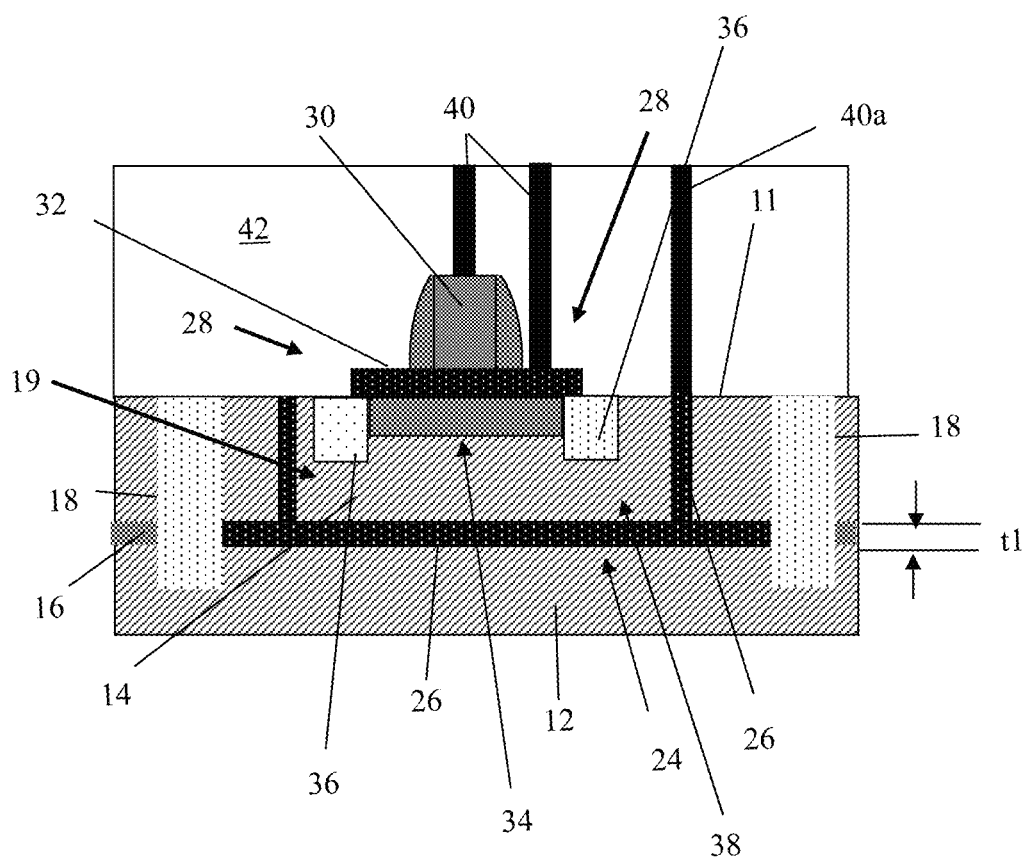
FIG. 5 shows a heterojunction bipolar transistor with contacts to an emitter, extrinsic base and sub-collector region, amongst other features, and respective fabrication processes in accordance with aspects of the present disclosure.

FIG. 5 shows a heterojunction bipolar transistor with contacts to the emitter, extrinsic base and sub-collector region, amongst other features, and respective fabrication processes in accordance with aspects of the present disclosure. More specifically, the heterojunction bipolar transistor 28 is provided between the deep trench isolation structure 18 and within the device region 19. In this non-limiting example, the heterojunction bipolar transistor 28 includes an emitter 30, an extrinsic base 32, and a collector region 34 in the semiconductor layer 14, bounded by shallow trench isolation regions 36. A sub-collector region 38 is provided below the collector region 34, electrically contacting the conductive material 26.

By way of non-limiting example and as should be understood by those of ordinary skill in the art, the extrinsic base 32 can be a raised extrinsic base 32 comprising Si or SiGe, as examples. And, as should be understood by those of ordinary skill in the art, in one exemplary embodiment, the raised extrinsic base 32 can be grown as a single crystalline semiconductor material over single crystalline material of the semiconductor layer 14 (with poly material growing over the shallow trench isolations 36). The emitter 30 can also be a single crystalline epitaxial material with sidewall structures, e.g., nitride based sidewalls. The collector region 34 can comprise semiconductor material, e.g., undoped Si material, which is in in electrical contact with the sub-collector region 38. It should be understood that the heterojunction bipolar transistor 28 in FIG. 5 is provided as an illustrative non-limiting example of such device, and that other configurations of the heterojunction bipolar transistor 28 are contemplated herein.

FIG. 5 further shows contacts 40 to the emitter 30 and raised extrinsic base 32, and collector contact 40a to the sub-collector region 38. In embodiments, the collector contact 40a electrically contacts to the collector region 34 with the aid of the conductive material 26 within the sub-collector region 38. The collector contact 40a is positioned between the heterojunction bipolar transistor 28 and the deep trench isolation structure 18, and more specifically between the shallow trench isolation structure 36 and the deep trench isolation structure 18. Moreover, the electrical connection using the conductive material within the sub-collector region 38 will effectively lower the resistance to the collector region 34 and increase fT/fMAX.

Prior to contact formation, silicide contacts are formed in contact with the emitter 30 and the extrinsic base 32. As should be understood by those of skill in the art, the silicide process begins with deposition of a thin transition metal layer, e.g., nickel, cobalt or titanium, over fully formed and patterned semiconductor materials. After deposition of the material, the structure is heated allowing the transition metal to react with exposed silicon (or other semiconductor material as described herein) forming a low-resistance transition metal silicide contact. Following the reaction, any remaining transition metal is removed by chemical etching, leaving silicide contacts.

A dielectric material 42 is deposited over the structure, followed by lithography, etching and deposition processes (e.g., metallization process) to form the contacts 40. For example, the dielectric material 42 is deposited by a CVD process, followed by the lithography and etching (e.g., RIE) processes to form trenches within the dielectric material 42. A metal material, e.g., aluminum or tungsten, is deposited within the trenches to form the contacts 40, e.g., collector contact, emitter region contact and extrinsic base contact. Any residual metal material can be removed from the surface of the dielectric material 38 by a conventional chemical mechanical planarization process.

The heterojunction bipolar transistor can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a first semiconductor layer including a device region;
a second semiconductor layer under the first semiconductor layer;
a layer of conductive material between the first semiconductor layer and the second semiconductor layer;
at least one contact extending through the first semiconductor layer and contacting the layer of conductive material; and
a device in the device region above the layer of conductive material, the device comprising at least an extrinsic base composed of semiconductor material located on the first semiconductor layer and remote from the at least one contact.

2. The structure of claim 1, further comprising a deep trench isolation structure surrounding the device region and extending to below the layer of conductive material.

3. The structure of claim 2, wherein the conductive material is a metal material that extends within a subcollector region and collector region of a heterojunction bipolar transistor.

4. The structure of claim 3, wherein the metal material is one of Al, Co, Ni, Pt, Ta, W and TiN.

5. The structure of claim 3, wherein the subcollector region and collector region are within the first semiconductor layer.

6. The structure of claim 1, wherein the at least one contact is a collector contact of the heterojunction bipolar transistor that extends within the first semiconductor layer and remote from the device.

7. The structure of claim 6, wherein the collector contact is positioned between the heterojunction bipolar transistor and the deep trench isolation structure.

8. The structure of claim 7, wherein the collector contact is positioned between a shallow trench isolation structure and the deep trench isolation structure.

9. The structure of claim 1, wherein the layer of conductive material is bounded by the first semiconductor layer, the second semiconductor layer and a deep trench isolation structure.

10. A structure comprising:
a first semiconductor layer;
a second semiconductor layer under the first semiconductor layer;
a deep trench isolation structure extending through the first semiconductor layer and the second semiconductor layer, and defining a device region;
a transistor within the device region, the transistor comprising at least an extrinsic base over the first semiconductor layer;
a layer of conductive material between the first semiconductor layer and the second semiconductor layer and extending underneath the transistor; and
at least one contact extending through the first semiconductor layer, remote from the extrinsic base and contacting the layer of conductive material.

11. The structure of claim 10, wherein the transistor is a heterojunction bipolar transistor and the conductive material is a metal material that extends within a subcollector region and collector region of the heterojunction bipolar transistor, the bipolar transistor comprising at least an extrinsic base composed of semiconductor material located on the first semiconductor layer and remote from the at least one contact.

12. The structure of claim 11, wherein the metal material is one of Al, Co, Ni, W and TiN.

13. The structure of claim 11, wherein the subcollector region and collector region are within the first semiconductor layer.

14. The structure of claim 11, wherein the at least one contact is a collector contact of the heterojunction bipolar transistor, positioned between the heterojunction bipolar transistor and the deep trench isolation structure.

15. The structure of claim 14, wherein the collector contact is positioned between a shallow trench isolation structure and the deep trench isolation structure.

16. The structure of claim 10, wherein the layer of conductive material is bounded by the first semiconductor layer, the second semiconductor layer and the deep trench isolation structure.

17. The structure of claim 10, wherein the first semiconductor layer and the second semiconductor layer comprise Si material.

18. The structure of claim 10, wherein the at least one contact fills an opening within the first semiconductor layer, on a side of the transistor.

19. The structure of claim 10, wherein:
the conductive material extends between deep trench isolation structures;
the deep trench isolation structures extend below the conductive material and into the second semiconductor layer;
the transistor is between shallow trench isolation structures,
the shallow trench isolation structures extend into the first semiconductor layer;
the shallow trench isolation structures are within a region defined between the deep trench isolation structures;
the transistor comprises a raised extrinsic base region on the first semiconductor layer; and
the at least one contact extends on a side of the raised extrinsic base region, between the shallow trench isolation structures and the deep trench isolation structures.

20. A method comprising:
forming a first semiconductor layer;
forming a second semiconductor layer above the first semiconductor layer;
forming a layer of conductive material on the first semiconductor layer by forming an airgap between the first semiconductor layer and the second semiconductor layer, and filling the air gap with the conductive material;
forming an opening in the second semiconductor layer, extending to the layer of conductive material; and
forming a device on the second semiconductor layer above the layer of conductive material.

* * * * *